US012787165B2

(12) United States Patent
Zhang et al.

(10) Patent No.: US 12,787,165 B2
(45) Date of Patent: Nov. 3, 2026

(54) METAL FOIL, CIRCUIT BOARD, AND METHOD FOR MANUFACTURING CIRCUIT BOARD

(71) Applicant: GUANGZHOU FANGBANG ELECTRONICS CO., LTD., Guangzhou (CN)

(72) Inventors: Meijuan Zhang, Guangzhou (CN); Yuhua Zhu, Guangzhou (CN)

(73) Assignee: GUANGZHOU FANGBANG ELECTRONICS CO., LTD., Guangzhou (CN)

( * ) Notice: Subject to any disclaimer, the term of this patent is extended or adjusted under 35 U.S.C. 154(b) by 308 days.

(21) Appl. No.: 18/682,745

(22) PCT Filed: May 30, 2022

(86) PCT No.: PCT/CN2022/095914
§ 371 (c)(1),
(2) Date: Feb. 9, 2024

(87) PCT Pub. No.: WO2023/016061
PCT Pub. Date: Feb. 16, 2023

(65) Prior Publication Data

US 2024/0349423 A1 Oct. 17, 2024

(30) Foreign Application Priority Data

Aug. 9, 2021 (CN) ........................ 202110909511.5

(51) Int. Cl.
*H05K 1/09* (2006.01)
*H05K 3/02* (2006.01)
*H05K 3/06* (2006.01)

(52) U.S. Cl.
CPC ............... *H05K 1/09* (2013.01); *H05K 3/025* (2013.01); *H05K 3/06* (2013.01); *H05K 3/064* (2013.01);
(Continued)

(58) Field of Classification Search
CPC .... H05K 3/202; H05K 3/4652; H05K 3/4658; H05K 2201/0355; H05K 2203/0156; H05K 2203/0191
See application file for complete search history.

(56) References Cited

FOREIGN PATENT DOCUMENTS

CN 105472883 A 4/2016
CN 105746003 A 7/2016
(Continued)

OTHER PUBLICATIONS

JP 2020180366 A Translation (Year: 2026).*
(Continued)

*Primary Examiner* — Timothy J Thompson
*Assistant Examiner* — John B Freal
(74) *Attorney, Agent, or Firm* — Riverside Law LLP

(57) ABSTRACT

Provided is a metal foil, including a conductive layer and a bearing layer, the conductive layer and the bearing layer being stacked. The conductive layer is configured to manufacture a conductive line. When a circuit board is manufactured using the metal foil, the bearing layer is separated from the conductive layer by a first etching solution, and a roughness Rz of a surface, close to the conductive layer, of the bearing layer is less than or equal to 2 microns. When the circuit board is manufactured using the metal foil, a surface of the conductive line is flush with a surface of a substrate after the bearing layer is removed, and the surface roughness of the conductive line is low, so that the product requirement for high dimensional accuracy may be satisfied. Embodiments of the present disclosure correspondingly provide a
(Continued)

circuit board and a method for manufacturing the circuit board.

18 Claims, 4 Drawing Sheets

(52) U.S. Cl.
CPC ....... *H05K 3/067* (2013.01); *H05K 2201/032* (2013.01); *H05K 2201/0338* (2013.01); *H05K 2201/0355* (2013.01)

(56) References Cited

FOREIGN PATENT DOCUMENTS

| | | | | | |
|---|---|---|---|---|---|
| CN | 108701656 | A | | 10/2018 | |
| CN | 113646469 | A | * | 11/2021 | ........... C25D 7/0614 |
| CN | 113811093 | A | | 12/2021 | |
| JP | 2003011267 | A | | 1/2003 | |
| JP | 2003101197 | A | | 4/2003 | |
| JP | 2003218500 | A | * | 7/2003 | |
| JP | 2004063701 | A | | 2/2004 | |
| JP | 2004228108 | A | | 8/2004 | |
| JP | 2006229115 | A | | 8/2006 | |
| JP | 2014027288 | A | | 2/2014 | |
| JP | 2017224848 | A | | 12/2017 | |
| JP | 2020088062 | A | | 6/2020 | |
| JP | 2020180366 | A | * | 11/2020 | ............. B32B 15/08 |

OTHER PUBLICATIONS

JP 2003218500 A Translation (Year: 2026).*
CN 113646469 A Translation (Year: 2026).*
Japanese Office Action (including English translation) issued in App. No. JP2024508440, dated Feb. 25, 2025, 14 pages.

* cited by examiner

METAL FOIL, CIRCUIT BOARD, AND METHOD FOR MANUFACTURING CIRCUIT BOARD

CROSS-REFERENCE TO RELATED APPLICATIONS

This application is a U.S. national phase application filed under 35 U.S.C. § 371 claiming benefit to International Patent Application No. PCT/CN2022/095914, filed May 30, 2022, which claims priority to Chinese Patent Application No. 202110909511.5, filed Aug. 9, 2021, the contents of each of which are incorporated by reference herein in their entireties.

TECHNICAL FIELD

The present disclosure relates to the technical field of metal foils, and in particular to a metal foil, a circuit board, and a method for manufacturing the circuit board.

BACKGROUND

An embedded circuit board is a circuit board in which a conductive line is embedded in a circuit board substrate. As shown in FIG. 1, in applications where circuit sensitivity is required, it is necessary to ensure that a surface of the conductive line is flat and the conductive line is substantially flush with a surface of a substrate or slightly protrudes from the surface of the substrate, so as to ensure that the conductive line is able to be in reliable contact with other components, thereby stably conducting signals. In addition, for products with high dimensional accuracy requirements, a height difference between the surface of the conductive line and the surface of the substrate needs to be controlled within a certain range.

At present, in order to ensure that the height difference between the surface of the conductive line and the surface of the substrate is controlled within the certain range, an existing main process flow for manufacturing the circuit board is as follows.

(1) A releasable metal foil is provided. The metal foil includes a carrier layer and a conductive layer which are stacked.

(2) Film pasting, exposure and development operations are performed on the conductive layer to obtain a masking pattern. An area, masked by the masking pattern, of the conductive layer is a non-conductive line area, and an area, not masked by the masking pattern, of the conductive layer is a conductive line area.

(3) The conductive line area is thickened by electroplating.

(4) A surface, forming the conductive line, of the metal foil and the substrate are pressed, and the carrier layer is removed in a peel-off manner (that is, the carrier layer is torn using an external force).

(5) The conductive layer is etched using an etching solution to remove the conductive layer in the releasable metal foil to form the conductive line.

(6) A surface treatment is performed on the conductive line, so that the surface of the conductive line is substantially flush with the surface of the substrate or is a certain height above the surface of the substrate.

In practical applications, when the conductive layer is etched using the etching solution to remove the conductive layer in the releasable metal foil in step (5), a material of the conductive line formed by thickening is the same as a material of the conductive layer in the releasable metal foil, so that the etching solution may etch both the conductive layer and the conductive line formed by thickening. Moreover, in order to satisfy a complete etching of the conductive layer at a lower part of the substrate, and avoid a phenomenon of micro-short circuit caused by an incomplete etching of the conductive layer at the lower part of the substrate, an over-etching is often used in a process of etching the conductive layer, as shown in FIG. 1 and FIG. 2, after the etching is finished, the conductive line is recessed in the substrate. In an actual production process, the conductive line is recessed in the substrate by more than 0.5 microns in a height direction, so that the process of step (6) is difficult to implement, for example, the conductive line is flush with the substrate or protrudes from the substrate by gold plating or nickel plating. At least the current process is difficult to perform the surface treatment based on such a high height difference, so that the conductive line after surface treatment is flush with the substrate or protrudes from the substrate. Meanwhile, the conductive line recessed in the substrate may also significantly increase the raw materials and processing costs for surface treatment. Further, an inability to achieve accurate control of an etching position in the etching process results in inconsistent degrees of over-etching on different parts of the conductive line and the substrate, leading to significant differences in roughness of different parts of the conductive line and the substrate. Therefore, the circuit board manufactured cannot satisfy the product requirement for high dimensional accuracy.

SUMMARY

Embodiments of the present disclosure aim to provide a metal foil, a circuit board, and a method for manufacturing the circuit board. When the circuit board is manufactured using the metal foil, a surface of a conductive line is substantially flush with a surface of a substrate after a bearing layer is removed, and a surface roughness of the conductive line is low, so that the product requirement for high dimensional accuracy may be satisfied.

In order to solve the above problem, the embodiments of the present disclosure provide a metal foil, including a conductive layer and a bearing layer, the conductive layer and the bearing layer being stacked. The conductive layer is configured to manufacture a conductive line. When a circuit board is manufactured using the metal foil, the bearing layer is separated from the conductive layer by a first etching solution, the conductive layer has corrosion resistance to the first etching solution, and a roughness Rz of a surface, close to the conductive layer, of the bearing layer is less than or equal to 2 microns.

In some embodiments, the roughness Rz of the surface, close to the conductive layer, of the bearing layer is less than or equal to 1 micron.

In some embodiments, the bearing layer includes a transition layer, the transition layer and the conductive layer being stacked. When the circuit board is manufactured using the metal foil, the transition layer is etched by the first etching solution, so that the bearing layer is separated from the conductive layer.

In some embodiments, the transition layer has a corrosion resistance to a second etching solution. The second etching solution is an etching solution capable of etching the conductive layer.

In some embodiments, the conductive layer is a copper layer, and the transition layer contains at least one of nickel, chromium, manganese, iron and cobalt elements.

In some embodiments, a thickness of the bearing layer is 8 microns to 105 microns.

In some embodiments, the bearing layer further includes a carrier layer, the transition layer being arranged between the carrier layer and the conductive layer.

In some embodiments, the material of the carrier layer is selected from at least one of metal and non-metal.

In some embodiments, when the circuit board is manufactured using the metal foil, the carrier layer is removed in a non-peel-off manner.

In some embodiments, when the circuit board is manufactured using the metal foil, the carrier layer is removed in a peel-off manner.

In some embodiments, the material of the transition layer has a corrosion resistance to a third etching solution. When the circuit board is manufactured using the metal foil, the carrier layer is etched by the third etching solution.

In some embodiments, the bearing layer further includes a release layer, the release layer being arranged between the carrier layer and the transition layer.

In some embodiments, a sum of thicknesses of the conductive layer and the transition layer is greater than or equal to 0.2 microns.

Correspondingly, the embodiments of the present disclosure further provide a circuit board. The circuit board is manufactured using a substrate and the metal foil.

Correspondingly, the embodiments of the present disclosure further provide a method for manufacturing a circuit board. The circuit board is manufactured using the metal foil. The method for manufacturing the circuit board includes the following operations.

Circuit manufacturing is performed on the conductive layer to obtain a conductive line.

The conductive line is combined with a substrate.

The bearing layer is removed.

In some embodiments, after the bearing layer is removed, the method further includes the following operation.

A surface treatment is performed on the conductive line, so that a height difference between a surface of the conductive line and a surface of the substrate is within a preset height difference range.

In some embodiments, the operation that circuit manufacturing is performed on the conductive layer to obtain the conductive line specifically includes the following operations.

Film pasting, exposure and development operations are performed on the conductive layer to obtain a masking pattern. An area, not masked by the masking pattern, of the conductive layer is a non-conductive line area.

The non-conductive line area is etched using a second etching solution.

The masking pattern is removed to obtain the conductive line.

In some embodiments, the operation that circuit manufacturing is performed on the conductive layer to obtain the conductive line specifically includes the following operations.

Film pasting, exposure and development operations are performed on the conductive layer to obtain a masking pattern. An area, not masked by the masking pattern, of the conductive layer is a conductive line area.

The conductive line area is thickened.

The masking pattern is removed.

Rapid etching is performed using the second etching solution to remove the non-thickened area of the conductive layer to obtain the conductive line.

In some embodiments, before film pasting, exposure and development operations are performed on the conductive layer to obtain the masking pattern, the method further includes the following operation.

The conductive layer is thinned.

In some embodiments, a multilayer circuit board is manufactured using the circuit board.

Correspondingly, the embodiments of the present disclosure provide a multilayer circuit board. The circuit board includes the circuit board and/or the circuit board manufactured by the method for manufacturing the circuit board.

Correspondingly, the embodiments of the present disclosure provide a method for manufacturing a multilayer circuit board, including the method for manufacturing the circuit board.

Compared with the related art, the embodiments of the present disclosure have the following beneficial effects that: the embodiments of the present disclosure provide the metal foil, including the conductive layer and the bearing layer, the conductive layer and the bearing layer being stacked. The conductive layer is configured to manufacture the conductive line. When the circuit board is manufactured using the metal foil, the bearing layer is separated from the conductive layer by means of the first etching solution, the conductive layer has corrosion resistance to the first etching solution, and the roughness Rz of the surface, close to the conductive layer, of the bearing layer is less than or equal to 2 microns. The roughness of the surface, close to the conductive layer, of the bearing layer in the metal foil provided by the embodiments of the present disclosure is less than or equal to 2 microns, so that the surface, close to the bearing layer, of the conductive layer also has a relatively low roughness. When the conductive line is formed using the metal foil provided by the embodiments of the present disclosure, and the circuit board is manufactured by the metal foil, the bearing layer is separated from the conductive layer by the first etching solution. The conductive layer has the corrosion resistance to the first etching solution, so that after the bearing layer is separated from the conductive layer by the first etching solution, a surface of the finally formed conductive line may substantially maintain a relatively low surface roughness of an original conductive layer to obtain a conductive line with a flat surface, and meanwhile, it is ensured that the surface of the conductive line is substantially flush with the surface of the substrate after the bearing layer is removed, so that the height difference between the surface of the conductive line and the surface of the substrate is conveniently controlled, and then a product requirement for high dimensional accuracy is satisfied. Meanwhile, the embodiments of the present disclosure further correspondingly provide the circuit board and the method for manufacturing the circuit board.

Herein, 10. Conductive line; 20. Substrate; 1. Conductive layer; 2. Transition layer; 3. Carrier layer; 4. Release layer; 11. Conductive line; 5. Substrate.

DETAILED DESCRIPTION OF THE EMBODIMENTS

The technical solutions in the embodiments of the present disclosure will be clearly and completely described in conjunction with the accompanying drawings in the embodiments of the present disclosure. It is apparent that the described embodiments are only a part of the embodiments of the present disclosure, and not all of them. All other embodiments obtained by those of ordinary skill in the art based on the embodiments of the present disclosure without creative efforts are within the scope of protection of the present disclosure.

Embodiment 1

Figure 1:
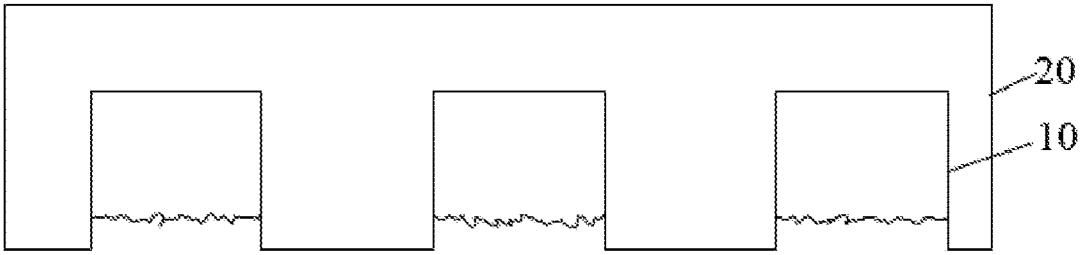
FIG. 1 is a schematic structural diagram of causing a surface of a conductive line to be recessed in a surface of a substrate when a circuit board is manufactured using an existing releasable metal foil.
Figure 2:
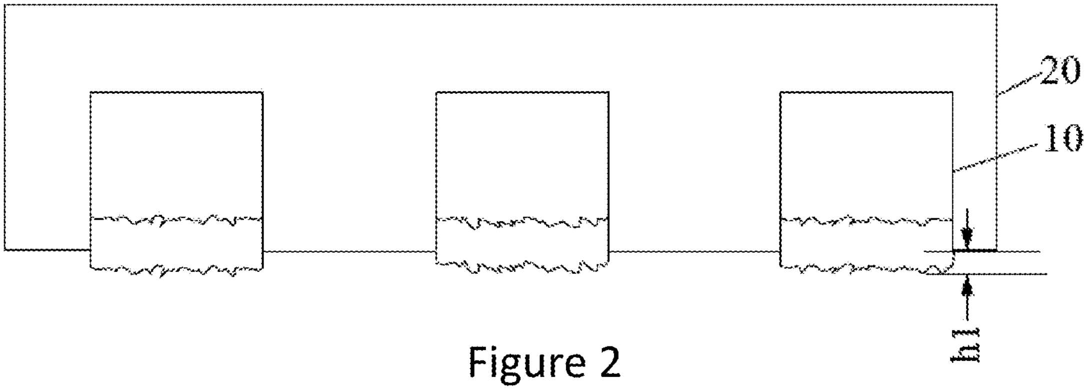
FIG. 2 is a schematic structural diagram of a circuit board manufactured using an existing releasable metal foil.
Figure 3:
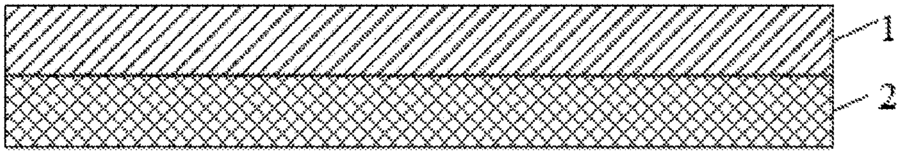
FIG. 3 is a schematic structural diagram of a metal foil according to Embodiment 1 of the present disclosure.
Figure 4:
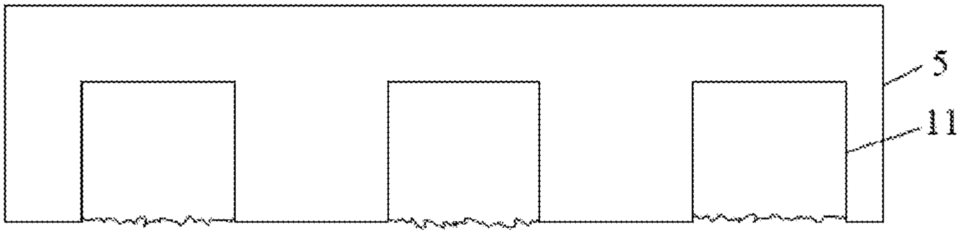
FIG. 4 is a schematic structural diagram of a circuit board according to Embodiment 1 of the present disclosure.

Referring to FIG. 3, in the embodiment of the present disclosure, a metal foil includes a conductive layer 1 and a bearing layer, the conductive layer 1 and the bearing layer being stacked. The conductive layer 1 is configured to manufacture a conductive line. When a circuit board is manufactured using the metal foil, the bearing layer is separated from the conductive layer 1 by a first etching solution, the conductive layer 1 has a corrosion resistance to the first etching solution, and a roughness Rz of a surface, close to the conductive layer, of the bearing layer is less than or equal to 2 microns.

In the embodiment of the present disclosure, the metal foil includes the conductive layer 1 and the bearing layer, the conductive layer 1 and the bearing layer being stacked. The conductive layer 1 is configured to manufacture the conductive line. When the circuit board is manufactured using the metal foil, the bearing layer is separated from the conductive layer 1 by the first etching solution, the conductive layer 1 has the corrosion resistance to the first etching solution, and the roughness Rz of the surface, close to the conductive layer, of the bearing layer is less than or equal to 2 microns. The roughness of the surface, close to the conductive layer, of the bearing layer in the metal foil provided by the embodiment of the present disclosure is less than or equal to 2 microns, so that the surface, close to the bearing layer, of the conductive layer also has a relatively low roughness. When the conductive line is formed using the metal foil provided by the embodiment of the present disclosure, and the circuit board is manufactured by the metal foil, the bearing layer is separated from the conductive layer 1 by the first etching solution. The conductive layer has the corrosion resistance to the first etching solution, so that after the bearing layer is separated from the conductive layer by the first etching solution, a surface of a finally formed conductive line may substantially maintain a relatively low surface roughness of an original conductive layer to obtain a conductive line with a flat surface, and meanwhile, it is ensured that the surface of the conductive line is substantially flush with the surface of the substrate after the bearing layer is removed, so that the height difference between the surface of the conductive line and the surface of the substrate is conveniently controlled, and then the product requirement for high dimensional accuracy is satisfied.

It is to be noted that the conductive layer 1 has the corrosion resistance to the first etching solution, which means that the conductive layer 1 is not or hardly corroded by the first etching solution, or the etching speed is relatively slow. The conductive layer 1 has the corrosion resistance to the first etching solution, so that when the circuit board is manufactured by the metal foil, if the bearing layer is separated from the conductive layer 1 by the first etching solution, the conductive layer 1 is not or hardly corroded by the first etching solution, or the etching speed is relatively slow. In the embodiment of the present disclosure, an appropriate etching solution may be selected to ensure that when the bearing layer is separated from the conductive layer 1 by the first etching solution, the first etching solution causes the surface of the conductive line to be recessed in the substrate at a depth of less than or equal to 0.5 microns. It is to be noted that a specific type of the first etching solution is not particularly limited, and may be selected by those skilled in the art according to actual needs, as long as the above functions are able to be achieved.

In a specific implementation, in order to achieve other functions, other structures may also be arranged between the bearing layer and the conductive layer 1, for example, structures such as an anti-oxidation layer are arranged between the bearing layer and the conductive layer 1. It is to be noted that the solution of arranging other structures between the bearing layer and the conductive layer 1 is also within the scope of protection of the present disclosure.

In the embodiment of the present disclosure, the roughness Rz of the surface, close to the conductive layer, of the bearing layer is less than or equal to 2 microns, for example, may be less than or equal to 2 microns, 1.5 microns, 1 micron, 0.5 microns, 0.2 microns, 0.1 microns, etc., in an embodiment, less than or equal to 1 micron. When the roughness of the surface, close to the conductive layer, of the bearing layer is within the above range, the roughness of the surface, close to the bearing layer, of the conductive layer is also substantially within the above range, that is, the surface, close to the bearing layer, of the conductive layer is relatively flat. Meanwhile, in the embodiment of the present disclosure, the conductive layer has the corrosion resistance to the first etching solution capable of separating the bearing layer from the conductive layer by etching, so that the surface, close to the bearing layer, of the conductive layer after the bearing layer is separated is less affected by the first etching solution, and then the surface of the finally formed conductive line substantially maintains the surface roughness of the surface, close to the bearing layer, of the original conductive layer, that is, the surface of the conductive line is relatively flat.

Referring to FIG. 3, the bearing layer includes a transition layer 2, the transition layer 2 and the conductive layer 1 being stacked. When the circuit board is manufactured using the metal foil, the transition layer 2 is etched by the first etching solution, so that the bearing layer is separated from the conductive layer 1. In the embodiment of the present disclosure, the transition layer 2 is etched by the first etching solution to remove the transition layer 2, so that the bearing layer is separated from the conductive layer 1, and the conductive layer 1 has the corrosion resistance to the first etching solution, that is, the conductive layer 1 is not or hardly etched by the first etching solution, or the etching speed is relatively slow.

It is to be noted that when the bearing layer only includes the transition layer 2, the transition layer 2 needs to provide a certain support force for the conductive layer 1, so that a thickness of the transition layer 2 needs to be relatively large. If the bearing layer further includes other structures capable of achieving the bearing effect, the thickness of the transition layer 2 may be set to be relatively small, for example, if a surface, far away from the conductive layer 1, of the transition layer 2 is provided with a carrier layer 3, the support force may be provided for the conductive layer 1 through the carrier layer 3, so that the thickness of the transition layer 2 may be set to be relatively small, of course, at this time, the thickness of the transition layer 2 may also be set to be relatively large to further provide the support force for the conductive layer 1. Therefore, a specific thickness of the transition layer 2 may be set according to actual use requirements, which will not be elaborated herein.

In an implementation, the transition layer 2 has corrosion resistance to a second etching solution. The second etching solution is an etching solution capable of etching the conductive layer 1. It is to be noted that the transition layer 2 has corrosion resistance to the second etching solution, which means that the transition layer 2 is not or hardly corroded by the second etching solution, or the etching speed is relatively slow. The transition layer 2 has corrosion resistance to the second etching solution, so that when the circuit board is manufactured using the metal foil, in a process of etching the conductive layer 1, the transition layer 2 is not or hardly corroded by the second etching solution, or the etching speed is relatively slow. It is to be noted that a specific type of the second etching solution is not particularly limited, and may be selected by those skilled in the art according to actual needs, as long as the above functions can be achieved.

In an implementation, the conductive layer 1 is a copper layer, and the transition layer 2 contains at least one of nickel, chromium, manganese, iron and cobalt elements, for example, at least one of nickel-chromium alloy, nickel-phosphorus alloy, and nickel metal. In the embodiment of the present disclosure, the conductive layer 1 is the copper layer, which is mainly composed of copper, and the transition layer 2 contains at least one of nickel, chromium, manganese, iron and cobalt elements. By taking the nickel-chromium alloy, the nickel-phosphorus alloy and the nickel metal as an example, the transition layer 2 may be mainly composed of the nickel-chromium alloy, the nickel-phosphorus alloy or the nickel metal, or may be mainly composed of any two or more of the nickel-chromium alloy, the nickel-phosphorus alloy and the nickel metal, or may be mainly formed by mixing at least one of the nickel-chromium alloy, the nickel-phosphorus alloy and the nickel metal with other materials. The transition layer 2 is of a single-layer or a multi-layer structure, when the transition layer 2 is of a multi-layer structure, for example, may be formed by stacking one layer of nickel metal and one layer of nickel-chromium alloy, or stacking one layer of nickel metal and one layer of nickel-phosphorus alloy, or stacking one layer of nickel-phosphorus alloy and one layer of nickel-chromium alloy. It is to be noted that in actual production, the conductive layer 1 and the transition layer 2 may be accidentally mixed with other impurities, and when the conductive layer 1 and the transition layer 2 are accidentally mixed with impurities, they are also within the scope of protection of the present disclosure. In addition, the conductive layer 1 in the present disclosure is not limited to the copper layer, the material of the transition layer 2 is also not limited to the nickel-chromium alloy, the nickel-phosphorus alloy and the nickel metal, and the conductive layer 1 and the transition layer 2 made of other materials containing at least one of the nickel, chromium, manganese, iron and cobalt elements are also within the scope of protection of the present disclosure. The specific materials and layer structures of the conductive layer 1 and the transition layer 2 may be set according to the actual use requirements, only to ensure that the conductive layer 1 has the corrosion resistance to the first etching solution, and the transition layer 2 has the corrosion resistance to the second etching solution, which will not be elaborated herein. Exemplarily, when the conductive layer is the copper layer and the transition layer is at least one of the nickel-chromium alloy, the nickel-phosphorus alloy and the nickel metal, the first etching solution may contain sulfuric acid, hydrogen peroxide and thiourea, or contain nitric acid, nickel chloride and imidazole (or azoles), or contain cyanide, and the second etching solution may contain ammonium chloride, copper sulfate pentahydrate and ammonia water.

In an implementation, in order to provide sufficient support force for the conductive layer 1, a thickness of the bearing layer in the embodiment is 8 microns to 105 microns, such as 8 microns, 10 microns, 15 microns, 20 microns, 25 microns, 30 microns, 35 microns, 40 microns, 45 microns, 50 microns, 55 microns, 60 microns, 65 microns, 70 microns, 75 microns, 80 microns, 85 microns, 90 microns, 95 microns, 100 microns, 105 microns, etc. Of course, a specific thickness of the bearing layer may be set according to the actual use requirements, which will not be elaborated herein.

Correspondingly, the embodiment of the present disclosure further provides a circuit board. The circuit board is manufactured using a substrate and the metal foil according to any one of the above implementations.

Figure 8:
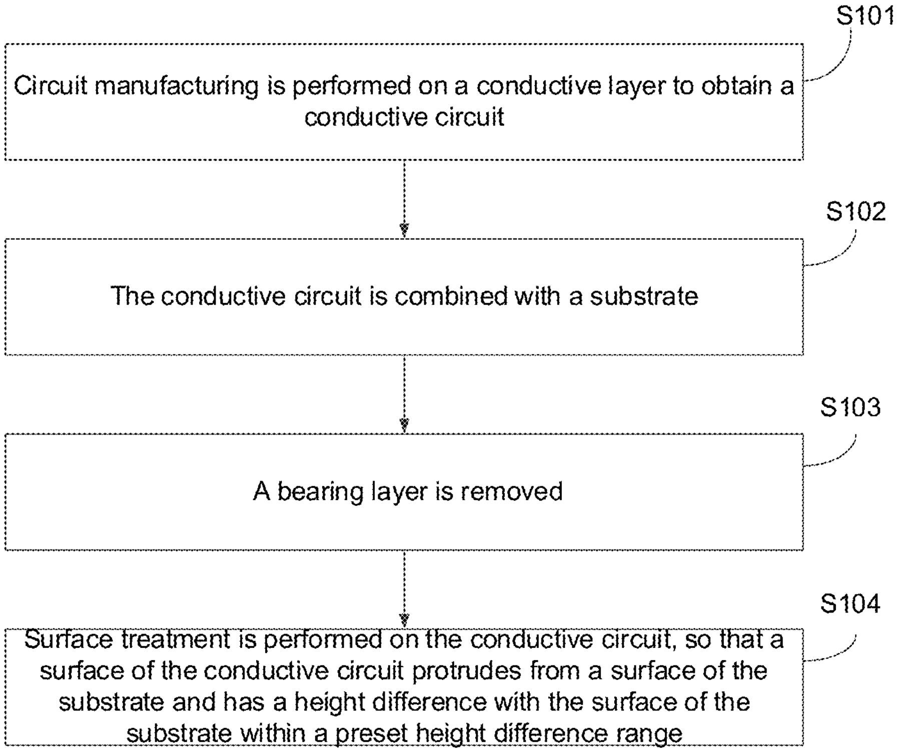
FIG. 8 is a flowchart of a method for manufacturing a circuit board provided by Embodiment 1 of the present disclosure.

Referring to FIG. 8, the embodiment of the present disclosure further provides a method for manufacturing a circuit board. The circuit board is manufactured using the metal foil. The method for manufacturing the circuit board includes the following operations.

At step S101, circuit manufacturing is performed on a conductive layer to obtain a conductive line.

At step S102, the conductive line is combined with a substrate.

At step S103, a bearing layer is removed.

In an implementation, after step S103, the method further includes the following operation.

At step S104, a surface treatment is performed on the conductive line, so that a height difference between a surface of the conductive line and a surface of the substrate is within a preset height difference range.

In a specific implementation, the surface treatment is performed on the conductive line to achieve an anti-oxidation effect, and meanwhile, the height difference between the surface of the conductive line and the surface of the substrate is within the preset height difference range to further ensure that the conductive line is able to be in reliable contact with other components, thereby stably conducting signals.

In an implementation, an operation that surface treatment is performed on the conductive line, so that the height difference between the surface of the conductive line and the surface of the substrate is within the preset height difference range layer in step S104 specifically includes the following operation.

Figure 5:
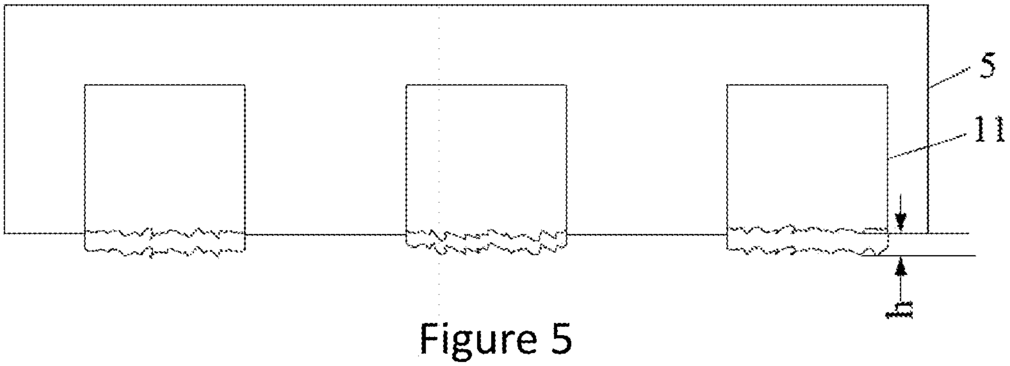
FIG. 5 is a schematic structural diagram of a circuit board with a conductive line subjected to surface treatment according to Embodiment 1 of the present disclosure.

The height difference between the surface of the conductive line and the surface of the substrate is within the preset height difference range by electroplating. For example, referring to FIG. 5, a layer of gold is electroplated on the surface of the conductive line 11, so that the surface of the conductive line 11 protrudes from the surface of the substrate 5 and has a height difference h with the surface of the substrate 5 within the preset height difference range, of course, other conductive materials may also be electroplated on the conductive line according to the actual use requirements, which will not be elaborated herein. Further, a specific form of surface treatment is not particularly limited, and may be selected by those skilled in the art according to actual needs, for example, any one of electroplating, chemical plating, evaporation plating, and sputtering, or a composite process thereof may be selected.

In a specific implementation, in order to prevent an oxidation of the conductive line, expensive materials such as electroplated gold are usually selected when surface treatment is performed on the conductive line. However, in the related art, a relatively thick metal needs to be electroplated during surface treatment, so that the production cost is significantly increased. Compared with the related art, the present disclosure does not need to electroplate the relatively thick metal, so that the production cost is greatly reduced. Meanwhile, the surface of the conductive line is flat after the bearing layer is removed, and the conductive line also has a flat surface after surface treatment, so that a circuit board formed may satisfy the products with high dimensional accuracy.

Figure 9:
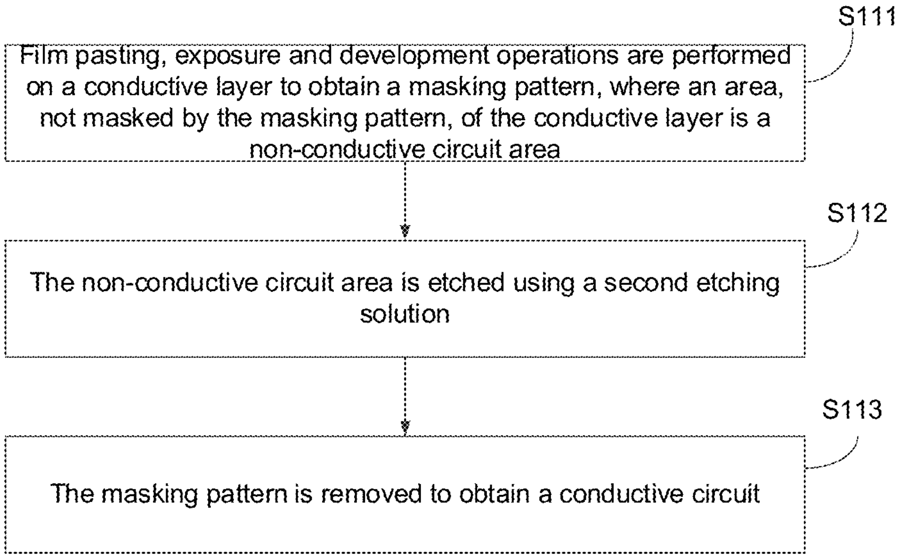
FIG. 9 is a flowchart of a first implementation of S101 of a method for manufacturing a circuit board provided by Embodiment 1 of the present disclosure.

Referring to FIG. 9, in an implementation, an operation that circuit manufacturing is performed on the conductive layer to obtain the conductive line in S101 specifically includes the following operations.

At step S111, film pasting, exposure and development operations are performed on the conductive layer to obtain a masking pattern. An area, not masked by the masking pattern, of the conductive layer is a non-conductive line area.

At step S112, the non-conductive line area is etched using a second etching solution.

At step S113, the masking pattern is removed to obtain the conductive line.

Figure 10:
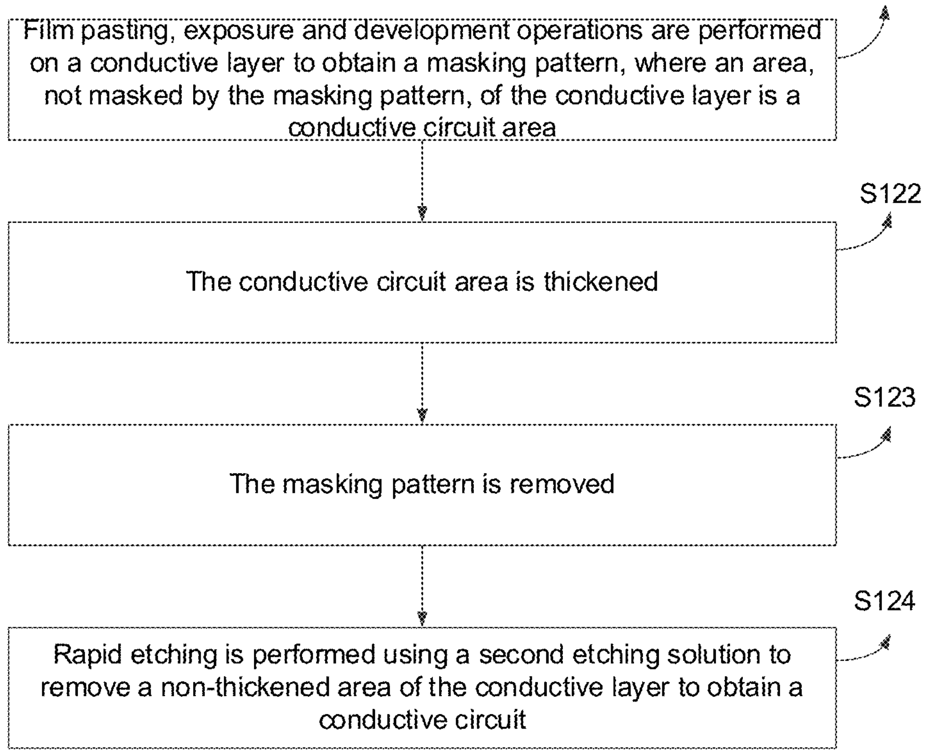
FIG. 10 is a flowchart of a second implementation of S101 of a method for manufacturing a circuit board provided by Embodiment 1 of the present disclosure.

Referring to FIG. 10, in another implementation, the operation that circuit manufacturing is performed on the conductive layer to obtain the conductive line in step S101 specifically includes the following operations.

At step S121, film pasting, exposure and development operations are performed on the conductive layer to obtain a masking pattern. An area, not masked by the masking pattern, of the conductive layer is a conductive line area.

At step S122, the conductive line area is thickened. For example, the conductive line area is thickened by electroplating.

At step S123, the masking pattern is removed.

At step S124, rapid etching is performed using the second etching solution to remove the non-thickened area of the conductive layer to obtain the conductive line.

In addition, before the operation that film pasting, optical and development operations are performed on the conductive layer to obtain the masking pattern in step S121, the conductive layer may also be thinned according to actual needs.

Further, those skilled in the art may use the circuit board to manufacture a multilayer circuit board according to actual needs. A number of layers of the multilayer circuit board and the manufacturing of the multilayer circuit board using an embedded circuit board and/or a circuit board with the conductive line protruding from the surface of the substrate are not limited in the present disclosure, and may be selected by those skilled in the art according to actual needs.

Embodiment 2

Figure 6:
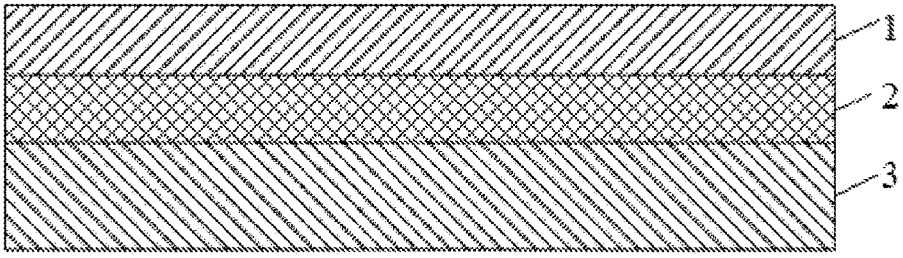
FIG. 6 is a schematic structural diagram of a metal foil including a carrier layer, a transition layer, and a conductive layer according to Embodiment 2 of the present disclosure.

Referring to FIG. 6, a metal foil in the embodiment differs from Embodiment 1 in that the bearing layer in the embodiment further includes a carrier layer 3, the transition layer 2 being arranged between the carrier layer 3 and the conductive layer.

In the embodiment of the present disclosure, a greater support force may be provided by arranging the carrier layer 3, so that the transition layer 2 may be set to be very thin. In a specific implementation, the transition layer 2 may be formed on the carrier layer 3 by an electroplating process, a sputtering process, evaporation plating, chemical plating, or a composite process thereof. In addition, it is to be noted that when the transition layer 2 has a relatively large thickness to provide sufficient support force, whether to arrange the carrier layer 3 may be selected as needed. A material of the carrier layer 3 is selected from at least one of metal and non-metal, for example, at least one selected from the metal, alloy, an organic matter, and an inorganic matter, or may be the above substance containing a dopant, of course, a thickness and material of the carrier layer 3 may be set according to actual use requirements, which will not be elaborated herein.

In an implementation, when the circuit board is manufactured using the metal foil, the carrier layer 3 is removed in a peel-off manner. Exemplarily, after the carrier layer 3 is released, the transition layer 2 may be removed by the first etching solution. It is to be noted that the carrier layer 3 is removed in a peel-off manner, which means that the carrier layer 3 is removed by an external force (for example, by manual tearing or tool tearing).

In another implementation, when the circuit board is manufactured using the metal foil, the carrier layer 3 is removed in a non-peel-off manner. It is to be noted that the carrier layer 3 is removed in a non-peel-off manner, which means that the carrier layer 3 is removed in a manner other than tearing through the external force, for example, the carrier layer 3 is removed by at least one of physical grinding, etching through the etching solution, plasma etching, and laser etching. Exemplarily, the carrier layer 3 is removed by etching through the etching solution, specifically, a material of the transition layer 2 has a corrosion resistance to a third etching solution. When the circuit board is manufactured using the metal foil, the carrier layer 3 is etched by the third etching solution 3. It is to be noted that the transition layer 2 has the corrosion resistance to the third etching solution, which means that the transition layer 2 is not or hardly corroded by the third etching solution, or an etching speed is relatively slow. The transition layer 2 has the corrosion resistance to the third etching solution, so that when the circuit board is manufactured using the metal foil, in a process of etching the carrier layer 3, the transition layer 2 is not or hardly corroded by the third etching solution, or the etching speed is relatively slow. Further, the third etching solution may be an etching solution capable of etching the conductive layer, or may be an etching solution incapable of etching the conductive layer, and may be selected by those skilled in the art according to actual needs, and similarly, the third etching solution and the second etching solution may be the same or different. It is to be noted that a specific type of the third etching solution is not particularly limited, and may be selected by those skilled in the art according to actual needs. Exemplarily, when the conductive layer is the copper layer, the transition layer is at least one of the nickel-chromium alloy, the nickel-phosphorus alloy and the nickel metal, and the carrier layer is copper, the first etching solution may contain sulfuric acid, hydrogen peroxide and thiourea, or nitric acid, nickel chloride and imidazole (or azoles), or cyanide, and the second etching solution and the third etching solution may independent contain ammonium chloride, copper sulfate pentahydrate and ammonia water.

Figure 7:
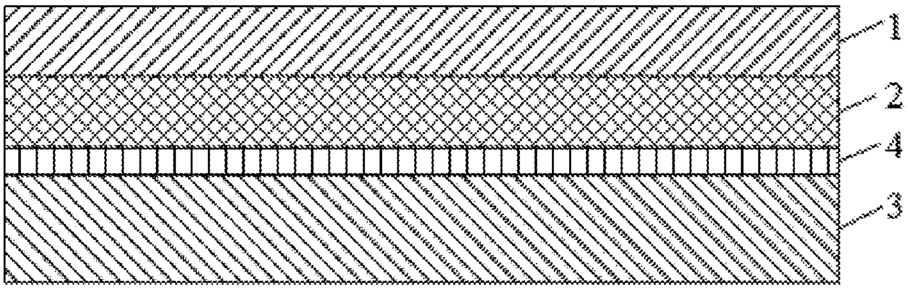
FIG. 7 is a schematic structural diagram of a metal foil including a carrier layer, a release layer, a transition layer, and a conductive layer according to Embodiment 2 of the present disclosure.

In some embodiments, referring to FIG. 7, in order to facilitate the release of the carrier layer 3, the bearing layer further includes a release layer 4, the release layer 4 being arranged between the carrier layer 3 and the transition layer 2. The release layer 4 is arranged, so that the carrier layer 3 may be easily removed in the peel-off manner. It is to be noted that when the carrier layer 3 is released, the release layer 4 may be released together with the carrier layer 3, or a part of the release layer 4 may remain on the transition layer 2 and needs to be released separately, and an other part may be released together with the carrier layer 3. In a specific implementation, in a process of manufacturing the circuit board, the layers may not accidentally fall off.

In some embodiments, for the metal foil with the releasable carrier layer and/or the release layer, in order to facilitate the release of the carrier layer and/or the release layer in the process of manufacturing the circuit board without affecting a subsequent manufacturing of the circuit board, a sum of the thicknesses of the conductive layer 1 and the transition layer 2 may be greater than or equal to 0.2 microns.

In a specific implementation, the conductive layer 1 is a copper layer, and the transition layer 2 contains at least one of nickel, chromium, manganese, iron and cobalt elements. In the embodiment of the present disclosure, the conductive layer 1 is the copper layer, which is mainly composed of copper, and the transition layer 2 contains at least one of nickel, chromium, manganese, iron and cobalt elements. By taking the nickel-chromium alloy, the nickel-phosphorus alloy or the nickel metal as an example, the transition layer 2 may be mainly composed of the nickel-chromium alloy, the nickel-phosphorus alloy and the nickel metal, or may be mainly composed of any two or more of the nickel-chromium alloy, the nickel-phosphorus alloy and the nickel metal, or may be mainly formed by mixing at least one of the nickel-chromium alloy, the nickel-phosphorus alloy and the nickel metal with other materials. The transition layer 2 is of a single-layer or a multi-layer structure, when the transition layer 2 is of a multi-layer structure, for example, it may be formed by stacking one layer of nickel metal and one layer of nickel-chromium alloy, or stacking one layer of nickel metal and one layer of nickel-phosphorus alloy, or stacking one layer of nickel-phosphorus alloy and one layer of nickel-chromium alloy. In addition, other materials may also be doped in the transition layer 2 according to actual needs, for example, silicon may be doped in the transition layer 2. By doping silicon in the transition layer 2, when the carrier layer 3 is etched by the etching solution, a blocking effect of the transition layer 2 may be increased to further avoid a penetration of the etching solution from the transition layer 2 to the conductive layer 1. It is to be noted that in an actual production, the conductive layer 1 and the transition layer 2 may be accidentally mixed with other impurities, and when the conductive layer 1 and the transition layer 2 are accidentally mixed with impurities, they are also within the scope of protection of the present disclosure. In addition, the conductive layer 1 in the present disclosure is not limited to the copper layer, the material of the transition layer 2 is also not limited to the nickel-chromium alloy, the nickel-phosphorus alloy and the nickel metal, and the conductive layer 1 and the transition layer 2 made of other materials containing at least one of the nickel, chromium, manganese, iron and cobalt elements are also within the scope of protection of the present disclosure. The specific materials and layer structures of the conductive layer 1 and the transition layer 2 may be set according to the actual use requirements, only to ensure that the conductive layer 1 has the corrosion resistance to the first etching solution, and the transition layer 2 has the corrosion resistance to the second etching solution, which will not be elaborated herein.

Correspondingly, the embodiment of the present disclosure further provides a circuit board. The circuit board is manufactured using a substrate and the metal foil according to any one of the above implementations. It is to be noted that the metal foil in Embodiment 2 may use any of the methods for manufacturing the circuit board provided by Embodiment 1 to manufacture the circuit board.

In some embodiments, those skilled in the art may use the circuit board to manufacture a multilayer circuit board according to actual needs. A number of layers of the multilayer circuit board and the manufacturing of the multilayer circuit board using the embedded circuit board and/or the circuit board with the conductive line protruding from the surface of the substrate are not limited in the present disclosure, and may be selected by those skilled in the art according to actual needs.

Compared with the related art, the embodiments of the present disclosure have following beneficial effects that: the embodiments of the present disclosure provide the metal foil, including the conductive layer 1 and the bearing layer, the conductive layer 1 and the bearing layer being stacked. The conductive layer 1 is configured to manufacture the conductive line. When the circuit board is manufactured using the metal foil, the bearing layer is separated from the conductive layer 1 by the first etching solution, the conductive layer 1 has the corrosion resistance to the first etching solution, and the roughness Rz of the surface, close to the conductive layer, of the bearing layer is less than or equal to 2 microns. The roughness of the surface, close to the conductive layer, of the bearing layer in the metal foil provided by the embodiment of the present disclosure is less than or equal to 2 microns, so that the surface, close to the bearing layer, of the conductive layer also has a relatively low roughness. When the conductive line is formed using the metal foil provided by the embodiment of the present disclosure, and the circuit board is manufactured by the metal foil, the bearing layer is separated from the conductive layer 1 by the first etching solution. The conductive layer has the corrosion resistance to the first etching solution, so that after the bearing layer is separated from the conductive layer by the first etching solution, the surface of the finally formed conductive line may substantially maintain the relatively low surface roughness of the original conductive layer to obtain the conductive line with the flat surface, and meanwhile, it is ensured that the surface of the conductive line is substantially flush with the surface of the substrate after the bearing layer is removed, so that the height difference between the surface of the conductive line and the surface of the substrate is conveniently controlled, and then the product requirement for high dimensional accuracy is satisfied. Meanwhile, embodiments of the present disclosure further correspondingly provide the circuit board and the method for manufacturing the circuit board.

The above description is merely some implementations of the present disclosure, and it is to be noted that those of ordinary skill in the art may also make several improvements and replacements without departing from the technical principle of the present disclosure, and it should be considered that these improvements and replacements shall all fall within the scope of protection of the present disclosure.

What is claimed is:

1. A metal foil, comprising a conductive layer and a bearing layer, the conductive layer and the bearing layer being stacked, wherein the conductive layer is configured to manufacture a conductive line; when a circuit board is manufactured using the metal foil, the bearing layer is separated from the conductive layer by a first etching solution; the conductive layer has a corrosion resistance to the first etching solution; and a roughness Rz of a surface, close to the conductive layer, of the bearing layer is less than or equal to 2 microns;

wherein the bearing layer comprises a transition layer, the transition layer and the conductive layer being stacked; when the circuit board is manufactured using the metal foil, the transition layer is etched by the first etching solution, so that the bearing layer is separated from the conductive layer; and wherein the transition layer has a corrosion resistance to a second etching solution, wherein the second etching solution is an etching solution capable of etching the conductive layer.

2. The metal foil according to claim 1, wherein the roughness Rz of the surface, close to the conductive layer, of the bearing layer is less than or equal to 1 micron.

3. The metal foil according to claim 1, wherein the conductive layer is a copper layer, and the transition layer contains at least one of nickel, chromium, manganese, iron and cobalt elements.

4. The metal foil according to claim 1, wherein a thickness of the bearing layer is 8 microns to 105 microns.

5. The metal foil according to claim 1, wherein the bearing layer further comprises a carrier layer, the transition layer being arranged between the carrier layer and the conductive layer.

6. The metal foil according to claim 5, wherein the material of the carrier layer is selected from at least one of metal and non-metal.

7. The metal foil according to claim 5, wherein when the circuit board is manufactured using the metal foil, the carrier layer is removed in a non-peel-off manner; or wherein when the circuit board is manufactured using the metal foil, the carrier layer is removed in a peel-off manner.

8. The metal foil according to claim 5, wherein a material of the transition layer has a corrosion resistance to a third etching solution, wherein when the circuit board is manufactured using the metal foil, the carrier layer is etched by the third etching solution.

9. The metal foil according to claim 5, wherein the bearing layer further comprises a release layer, the release layer being arranged between the carrier layer and the transition layer.

10. The metal foil according to claim 1, wherein a sum of thicknesses of the conductive layer and the transition layer is greater than or equal to 0.2 microns.

11. A circuit board, wherein the circuit board is manufactured using a substrate and the metal foil according to claim 1.

12. A method for manufacturing a circuit board, wherein the circuit board is manufactured using the metal foil according to claim 1, and the method for manufacturing the circuit board comprises:

performing circuit manufacturing on the conductive layer to obtain a conductive line;

combining the conductive line with a substrate; and removing the bearing layer.

13. The method for manufacturing the circuit board according to claim 12, wherein after removing the bearing layer, the method further comprises:

performing a surface treatment on the conductive line, so that a height difference between a surface of the conductive line and a surface of the substrate is within a preset height difference range.

14. The method for manufacturing the circuit board according to claim 12, wherein the performing circuit manufacturing on the conductive layer to obtain the conductive line specifically comprises:

performing film pasting, exposure and development operations on the conductive layer to obtain a masking pattern, wherein an area, not masked by the masking pattern, of the conductive layer is a non-conductive line area;

etching the non-conductive line area using a second etching solution; and removing the masking pattern to obtain the conductive line.

15. The method for manufacturing the circuit board according to claim 12, wherein the performing circuit manufacturing on the conductive layer to obtain the conductive line specifically comprises:

performing film pasting, exposure and development operations on the conductive layer to obtain a masking pattern, wherein an area, not masked by the masking pattern, of the conductive layer is a conductive line area;

thickening the conductive line area;

removing the masking pattern; and performing rapid etching using the second etching solution to remove a non-thickened area of the conductive layer to obtain the conductive line.

16. The method for manufacturing the circuit board according to claim 15, before performing film pasting, exposure and development operations on the conductive layer to obtain the masking pattern, further comprising:

thinning the conductive layer.

17. A multilayer circuit board, comprising the circuit board according to claim 11 and/or the circuit board manufactured by a method for manufacturing the circuit board, wherein the circuit board is manufactured using the metal foil, and the method for manufacturing the circuit board comprises:

performing circuit manufacturing on the conductive layer to obtain a conductive line;

combining the conductive line with a substrate; and removing the bearing layer.

18. A method for manufacturing a multilayer circuit board, comprising the method for manufacturing the circuit board according to claim 12.

* * * * *